United States Patent [19]

Deczky

[11] Patent Number: 4,638,441
[45] Date of Patent: Jan. 20, 1987

[54] DATA ACQUISITION SYSTEM FOR THE COMPUTER CONTROL OF ALUMINUM SMELTERS

[75] Inventor: Andrew E. Deczky, Ottawa, Canada

[73] Assignee: R.F.J. Associates Limited, Scarborough, Canada; a part interest

[21] Appl. No.: 615,730

[22] Filed: May 31, 1984

[30] Foreign Application Priority Data

Jan. 18, 1984 [CA] Canada ................................... 445554

[51] Int. Cl.⁴ .................... G01R 19/00; C25C 3/00; C25C 3/06; C25C 3/20
[52] U.S. Cl. ..................................... 364/483; 364/481; 364/500; 204/1 T; 204/67; 204/228; 204/244
[58] Field of Search ...................... 364/183, 481–483, 364/500, 571; 204/1 T, 244, 67, 228; 75/68 R; 266/99; 324/444, 446, 425, 64

[56] References Cited

U.S. PATENT DOCUMENTS

| | | | |
|---|---|---|---|
| 3,573,179 | 3/1971 | Dirth et al. | 204/67 |
| 3,625,842 | 12/1971 | Bristol et al. | 204/67 |
| 3,629,079 | 12/1971 | Bristol | 204/67 |
| 3,734,841 | 5/1973 | Thomas | 204/67 |
| 3,812,024 | 5/1974 | Goodnow et al. | 204/67 |
| 3,888,747 | 6/1975 | Murphy | 204/67 |
| 4,008,142 | 2/1977 | Dering et al. | 204/67 |
| 4,048,041 | 9/1977 | David et al. | 324/425 |
| 4,488,117 | 12/1984 | Seo | 204/1 T |

FOREIGN PATENT DOCUMENTS

| | | | |
|---|---|---|---|
| 762436 | 7/1967 | Canada. | |
| 768611 | 10/1967 | Canada. | |
| 808165 | 3/1969 | Canada. | |
| 823637 | 9/1969 | Canada. | |
| 891045 | 1/1972 | Canada | 204/49 |
| 894371 | 2/1972 | Canada. | |
| 996056 | 8/1976 | Canada. | |

Primary Examiner—Felix D. Gruber
Assistant Examiner—Danielle B. Laibowitz
Attorney, Agent, or Firm—Mitchell B. Wasson; Martin P. Hoffman; Charles W. Fallow

[57] ABSTRACT

Disclosed is a system for measuring cell potentials in an aluminum potline having a plurality of cells connected in series. The system enables better control of the cells than the current method which calculates cell resistance on the basis of measured cell potentials and potline current but an assumed value of back e.m.f. The present invention uses corrected voltage measurements and provides a decentralized, current independent cell potential measuring system which converts simultaneously all cell potentials during a normal integration period (e.g. 1 second) into a value corresponding to the potline current when it is at its normal (set-point) value. Simultaneously, various possible back e.m.f. values are measured with the same current relationship and computations made of the error caused by the non-ohmic portion of the cell potential when the current deviates from its normal (set-point) value. Sudden changes in current enable correct values of back e.m.f. to be determined.

10 Claims, 1 Drawing Figure

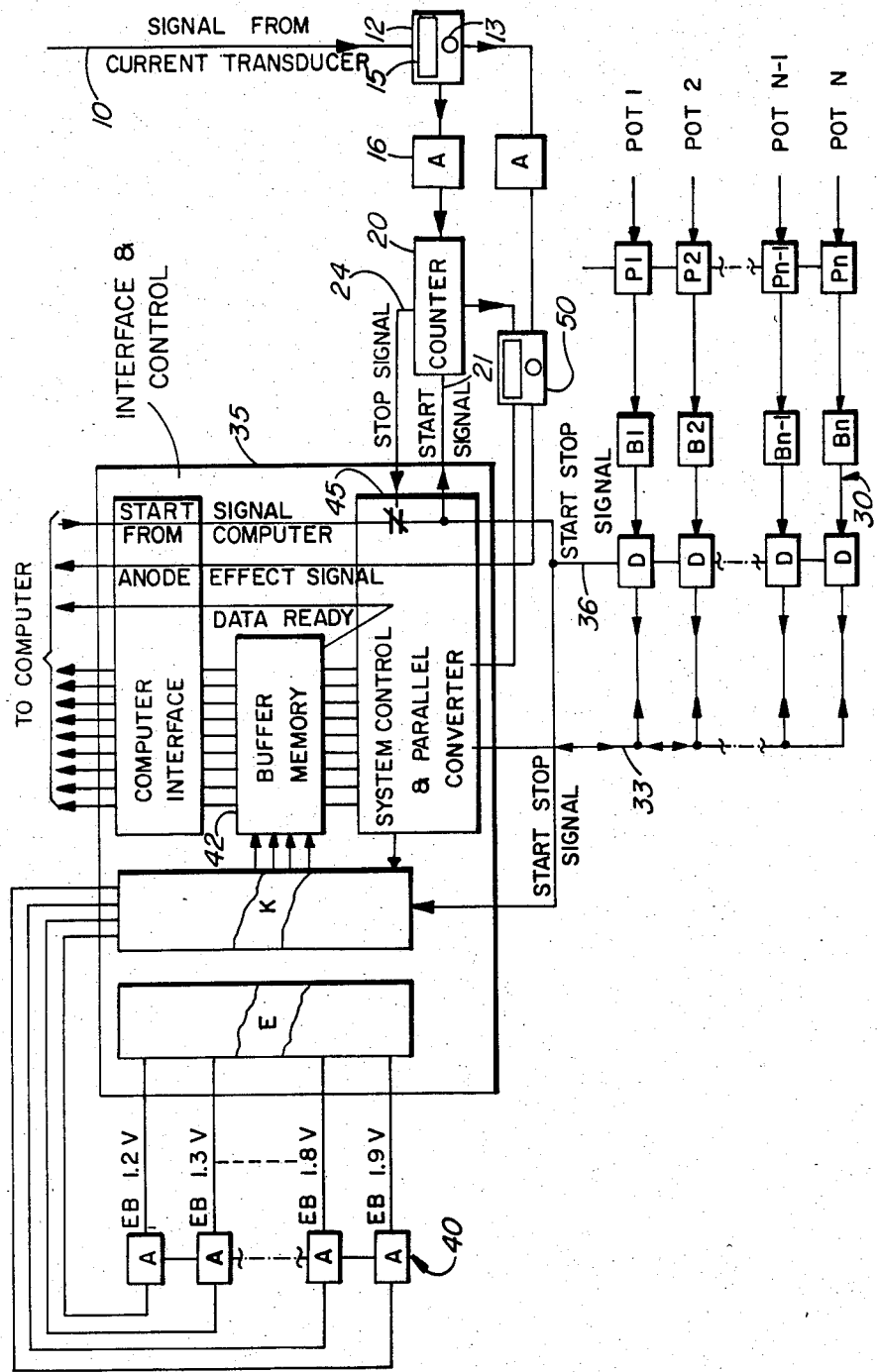

DATA ACQUISITION SYSTEM FOR THE COMPUTER CONTROL OF ALUMINUM SMELTERS

BACKGROUND OF THE INVENTION

This invention relates to a voltage integrating measuring system for parametric ratio control and more particularly to a data acquisition system for use in computer control of aluminum smelters.

At the present time aluminum is commonly produced by passing electric current through a cell or "pot" containing an electrolyte bath comprising essentially alumina and cryolite. The current flows between a moveable anode and a stationary cathode formed by the carbon lined steel shell, having above the carbon the molten aluminum covered by the cryolite. A large number of "pots" (e.g. 150 or more) are electrically connected in series to form a potline.

Alumina is fed periodically to the cryolite bath to replenish the consumed amount, which has been converted to aluminum and oxygen. Without firm knowledge of the actual concentration it is hard to control the required rate of feed and avoid the danger of overfeed. Traditionally, "anode effects" have been used as low concentration check-points to avoid overfeed. With the necessity of automation and a variety of automated feed systems the control of the concentration became an essential part of successful operation.

The current method to control the individual "pots" uses the established formula to obtain "R"—the resistance of the electrolyte cell:

$$R = \frac{V - V_b}{I}$$

Where:
V = the total cell potential,
Vb = the assumed value of the back e.m.f.,
I = the potline current.

The pot potentials (V) are sequentially measured for each pot simultaneously with the pertaining potline current (I). The assumed back e.m.f. (Vb) is subtracted from the total potential (V) and divided by the measured current (I). A batch of about four such measurements per five minute period are stored in a computer memory for later conversion. Since the Vb value is an assumed, or a statistically derived one, the individual confidence limit is low.

A large smelter with several potlines may have several hundreds of cells so that the gathering sequentially of the required voltage and current data is a complex and time consuming process. The ratio between the individual measuring time and the total cycle time is in the order of 1/10,000—insufficient to obtain the narrow measuring range required to monitor the depletion of the concentration. Further, it requires the use of a large number of measuring cables, complex scanning units and expensive measuring units. The known scanning systems limit the amount of data which can be acquired within the available time. They cannot follow the natural low frequency components of the cell voltage, and the measured data, being out of rhythm, is inaccurate.

SUMMARY OF THE INVENTION

The present invention is based on the natural, integrated and corrected, VOLTAGE measurement as opposed to the known system of resistance calculation based on assumed values of the back e.m.f. (Vb), which can be incorrect by up to ±30 300mV. It provides a decentralized, digital, current independent cell potential measuring system which converts simultaneously all cell potentials during a nominal integration period (e.g. 1 second) into a value corresponding to the potline current when it is at its normal (set point) value. Simultaneously, the control interface measures various possible back e.m.f. values with the same current relationship, and computes the error caused by this non-ohmic portion of the cell potential when the current deviates from its normal (set point) value.

The results of the voltage and the back e.m.f. counts are immediately buffered, liberating the counting units for the next measuring cycle. The central control serially and sequentially calls the so measured data and stores it in parallel form until the computer requests transmission. The back e.m.f. errors are corrected by the computer to obtain the true (constant current) voltages. Using a quasi-uninterrupted sequence of measurements (e.g.—a set of 25) a running average can be formed assuring low frequency filtering beyond the already integrated one second measuring interval. The range of the subsequent 1 second integrals pertaining to the same cell is compiled in the computer, and excessive fluctuations are recognised as (shaky) malfunctions.

The result of the technique according to the invention is a straight continuum of the corrected cell potential representing stable potline current condition (I at set point). If the selected back e.m.f. is incorrect during the event of a change in potline current, e.g. a current drop such as caused by an anode effect or a controlled current drop, the prior gradual (modified) rate of change of cell potential will deviate from its normal continuum, so the error can be established and the proper back e.m.f. computed. Since such change is directly related to the alumina concentration, and such current drops are normally occurring with ½ hour frequency, a control program for feed and thermal control of the cells is possible.

The computer oriented measuring and data acquisition system of this invention, for use in controlling potrooms, departs entirely from the traditional resistance control concept, and does not use assumed back e.m.f. values. The burden of sequentially measuring, transmitting and storing voltage and pertaining current values, and—after multiple measurements—calculating from such data the cell resistance, is eliminated. The individual and complex cables for analogue data transmission with their dangerous potentials to ground are replaced with optically isolated serial fiberoptic datalinks. The complex scanning and expensive measuring units are replaced with individual units which can integrate the cell potentials with one second multiples in an almost uninterrupted sequence.

In accordance with the broad aspect of the invention, there is provided a method of measuring current independent corrected cell potentials in an aluminum potline having a plurality of cells connected in series, comprising:

(a) generating a first signal having a frequency proportional to current through said cells, said signal having a predetermined frequency when said current is at a set-point value, (b) determining a time interval by counting cycles of said first signal from a start time until a predetermined count value is reached, (c) generating a plurality of second signals each having a frequency proportional to total voltage across a different one of said cells, (d) generating a plurality of third signals each having a frequency proportional to different possible values of back e.m.f. of a cell, (e) counting cycles of said second signals during said time interval to obtain counts proportional to current independent total cell voltages, (f) using said third signals to decrement, during said time interval, counters having counts proportional to the different possible values of back e.m.f. to thereby determine any error values that might exist for the back e.m.f. values as a result of a change in said current from its set-point value, and (g) algebraically subtracting the error values determined in step (f) from the current independent total cell voltages to determine current independent corrected cell voltages.

The invention also provides apparatus for carrying out the method according to the invention.

BRIEF DESCRIPTION OF THE DRAWING

An embodiment of the invention will now be described in conjunction with the accompanying drawing which comprises a block diagram of cell potential measurement apparatus according to the invention.

DESCRIPTION OF THE PREFERRED EMBODIMENT

Referring to the drawing, line 10 carries a signal from a current transducer (not shown) which is proportional to the current flowing through the series connected pots or cells (P), the current feed not being illustrated. The signal on line 10 is fed to a current target unit 12 having an adjustment knob 13 and an indicator dial 15. With the current feed in the pot line at its set point value (e.g. 100 kA), the knob 13 is adjusted to give a reading of 10 volts on dial 15. The 10 volt output of unit 12 is fed to a voltage-to-frequency converter 16 which, with a 10 volt input, produces 10 kHz output which is fed to a counter 20. The counter 20 starts counting upon receipt of a start signal on line 21 from the computer (not shown) and stops counting when it reaches a count of 10,000. Obviously, if the current is 100 kA, the counter will stop after one second; but it will stop sooner or later than 1 second if the current is higher or lower than 100 kA. When the counter 20 stops counting it issues a stop signal on line 24 which stops counting by other counters, to be discussed later.

Each cell or pot (P) is provided with a voltage-to-frequency converter (B) which continuously converts the cell potential into an equivalent frequency output which is optically coupled via fiberoptic lines 30 (to provide the required electrical isolation) to an associated serial branch unit D which may be mounted on the potroom structure (not shown).

Each serial branch unit D is an addressable serial emitter/receiver connected via fiberoptic (shared) party line 33 to a centrally located computer interface control unit 35. All branch units D share a common "start" and "stop" (counting) address line 36. A start signal on line 36 simultaneously connects all units D to begin counting the frequencies from their associated voltage-to-frequency converters B. The stop signal from counter 20 on line 24, discussed above, disconnects all units D at the same time to "freeze" their counts, and to transfer the said counts to their memories. The counts in units D are stored in digital format until the interface control unit 35 requests—by addressing the unit D in question—for serial transmission via the fiberoptic line 33. As soon as the counts are buffered in unit D's memories the counters are again operative.

Each unit D includes a counter, a memory, an output buffer and means for sending and receiving optical signals on fiberoptic line 33. Each counter preferably has a maximum range of 99000, corresponding with the frequency of the associated converter and 99.000 V maximum cell potential (anode effects). As mentioned above, the start/stop interval is nominally one second when the current is at set-point value. Each branch unit contains any necessary electronics to conform with required safety and bidirectional multistation protocol.

For ease of explanation it is assumed that the current target unit (12) produces an output of 10,000 mV when the pot line current is at its set-point value, e.g. 100 kA. In turn, this potential is converted by converter 16 into a 10 kHz frequency and therefore 10,000 counts equals one second elapsed time. The computer initiates, via the control interface 35, all branch and current unit "start count" commands. The "stop count" command is generated by the current counter 20 when it reaches a count of 10,000. It is obvious that a deviation of the current from its set point value will cause a proportional change in the time interval between the "start" and the "stop" commands. Higher current will shorten, and lower current will lengthen the time interval from its normal one second duration.

Any variation of the current from its set-point value will result in a variation of the ohmic part of the cell potential, although the back e.m.f. will not change. Consequently, the ohmic part of the cell potential measured in the manner explained above remains constant, even though the current is not at its set-point value. The non-ohmic part of the cell potential (the back e.m.f.) remains unchanged when the current varies, and this portion of the counted up cell potential contains an error which must be corrected. This error is monitored in the interface controller 35 for each selected back e.m.f., and transmitted, each measurement cycle, to the computer for the purpose of correcting the counted up potentials.

A back e.m.f. source E provides a plurality of possible back e.m.f. voltages—e.g. 1.2V., 1.3V., . . . 1.9V., and these voltages are fed to voltage-to-frequency converters 40 which, like converter 16, are 0 to 10 kHz units so that a 10 Volt input provides a 10 kHz output. Unit K is a back e.m.f. error detector which contains a plurality of counters which at the start of a measurement interval, contain counts proportional to the possible back e.m.f. values. During a measurement interval, these counters are decremented by the outputs of converters 40, and will count down to zero if the current is at its set-point value. If the current varies, the counters in unit K will, at the end of the measured interval, contain a non-zero number, either negative or positive depending on the direction (increase/decrease) in which the current varies. These counts in the counters of unit K at the end of the measurement interval constitute a measurement of the errors in the back e.m.f. portions of the cell voltage measurements occurring when the current varies from its set-point value. The contents of the counters in unit K are transferred to the buffer memory 42 at the end of each measuring cycle for use by the computer in correcting the measured total cell potential for its back e.m.f. errors. The error values for each selected back e.m.f., stored in buffer 42, are transmitted in advance of the cell voltage measurements (counts) to be eliminated from the transmitted cell potential according to the computer selected back e.m.f. If the current at a given measuring time was higher than normal, the error will be additive; in the case of lower current, the error will be subtractive.

The interface controller 35 includes a system control and a parallel converter 45 and it controls the branch units D and K, initiates start and stop commands, converts the serial transmission from branch units D into computer compatible parallel form and administers the communication protocol including the safety requirements and error conditions. Further, it monitors the back e.m.f. errors for each selected back e.m.f. value by using for each a separate voltage-to-frequency converter A, and counting, for each cycle, (in unit K) the difference between the current proportional and nominal potentials.

Since apart from the one second periodic oscillations superimposed upon the cell potential other, longer, periodic oscillations exist (16 to 60 seconds), the computer can use a set of consecutive measurements, time restricted only by the counters "clear" report. Further, this data can be averaged and evaluated individually (one second) to observe the excessive range of the unit data caused by cell malfunction (shaky cell). The averaged data produces a continuum of the pot potential with no oscillations, and the smooth data can be used for the control of the individual cells.

The notion of the variation in the value of the back e.m.f. being of utmost importance in the control of the pots, each time an anode effect occurs, or, in its absence, a controlled current drop is introduced, the computer is interrupted by unit 50—low current detector. In such an event, the computer introduces a new set of measurements, and compares the average of the values during the anode effect (or low current) with the averages before or after the event. If the assigned e.m.f. is incorrect the averages will differ proportionally and the change in the nonohmic back e.m.f. can be computed.

It is known that the back e.m.f. is related to the alumina concentration, and therefore an accurate computation of this value has significant importance in the overall control of the aluminum smelting process. The method offers a simple, and more exact, means of monitoring the essential parameters of the back e.m.f., alumina concentration, cell potential slope and pre-anode effect warning.

In understanding the invention it may be helpful to consider the following concrete examples:

EXAMPLE 1

| Parameters: | (1) | Current set point | = 100 kA |
|---|---|---|---|
| | (2) | Actual current | = 100 kA |
| | (3) | Total cell voltage (V) | = 5.000 volts |
| | (4) | Back e.m.f. (Vb) | = 1.600 volts |
| | (5) | Ohmic cell voltage | = 3.400 volts |

With the current at 100 kA the output of the target unit 12 is 10.000 volts, the output of the converter 16 is 10 kHz, and the counter 20 issues a stop signal after 1 second. During this 1 second the cell counter D will count to 5000, and the appropriate counter in unit K will be decremented to zero because, with the conditions given, there will be no Vb error.

EXAMPLE 2

| Parameters: | (1) | Current set point | = 100 kA |
|---|---|---|---|
| | (2) | Actual current | = 90 kA |
| | (3) | Total cell voltage (V) $\frac{3.400 \times 90}{100} + 1.600$ | = 4.660 volts |
| | (4) | Back e.m.f. (Vb) | = 1.600 volts |
| | (5) | Ohmic cell voltage $\frac{3.400 \times 90}{100}$ | = 3.060 volts |

With the current at 90 kA instead of 100 kA, counter 20 will not count to 10,000 until $10{,}000/9{,}000 = 1.1111$ seconds. The total cell voltage is now 4.660 volts, so its associated voltage to frequency converter will output a frequency of 4660 Hz, and over a time of 1.1111 seconds the count in D is $4660 \times 1.111 = 5178$. During the same time the counter in unit K associated with a Vb of 1.600 volts will be counted down by a count corresponding to $1.600 - (1.600 \times 1.1111) = 1.600 - 1.778 = -0.178$ volts, i.e., a count of $-178$. Subtracting 178 from the count in D (5178) yields 5000, which corresponds to 5.000 volts, this being the current independent cell voltage. Obviously, it is the same as in Example 1.

EXAMPLE 3

In this example, it is assumed that after a major feed of the pot the back e.m.f. (Vb) dropped from 1.600 volts to 1.300 volts, and a control device has moved the anode to restore the desired 5.000 volt target potential. This means that, because Vb has dropped by 300 mV, the anode raise has caused an increase in the ohmic voltage by 300 mV, from the 3.400 volt original to 3.700 volts (with the current at 100 kA). At this point, the computer is still basing its calculations on a Vb of 1.600 volts, which is incorrect, but Example 4 will illustrate how the computer determines that Vb is no longer correct.

| Parameters: | (1) | Current set point | = 100 kA |
|---|---|---|---|
| | (2) | Actual current | = 100 kA |
| | (3) | Total cell voltage | = 5.000 volts |
| | (4) | Back e.m.f. (Vb) | = 1.300 volts |
| | (5) | Ohmic cell voltage | = 3.700 volts |

Under these conditions, the output of target unit 12 is 10.000 volts, the output of converter 16 is 10 kHz, and the counter 20 issues a stop signal after 1 second. During this 1 second the cell counter D will count to 5000 and the appropriate counter in unit K will be decremented from 1.600 to 0, indicating (erroneously) that there is no Vb error.

EXAMPLE 4

Proceeding from the conditions of Example 3, let us assume that the potline current drops to 90 kA.

| Parameters: | (1) | Current set point | = 100 kA |
|---|---|---|---|
| | (2) | Actual current | = 90 kA |
| | (3) | Total cell voltage (V) = $\frac{3.700 \times 90}{100} + 1.300$ | = 4.630 volts |
| | (4) | Back e.m.f. (Vb) | = 1.300 volts |

-continued (5) Ohmic cell voltage =

$$\frac{3.700 \times 90}{100} = 3.330 \text{ volts}$$

At 90 kA the cell counter D will count $4630 \times 1.1111 = 5144$ and the counter in unit K will be decremented by $1600 \times 1.1111 = 1777$ from its initial count of 1600 resulting in a reading of $-177$. Subtracting this from the cell counter reading of 5144 yields a value of 4967 (4.967 volts) whereas the correct value for the current independent cell voltage (the voltage when I = 100 kA) is 5.000 volts. The computer can recognize the sudden change in the value of the cell voltage, and recognize that the value of Vb must have changed from 1.600 volts. By trying other values of Vb it will soon see that the correct value is 1.300 volts and not 1.600 volts. With Vb = 1.300 volts, the associated counter in unit K will be decremented by $1300 - (1300 \times 1.1111) = -144.4$ 144. Subtracting this from the cell counter reading (5144) yields 5000, corresponding to 5.000 volts, the correct value of the current independent cell voltage. The computer will now use the new value of Vb until later measurements during further current drops show a need to change it again.

An anode effect in any cell will cause a current drop and current drops can be deliberately caused periodically, e.g. every ½ hour, so that an incorrect Vb value for any cell will not go undetected for long.

The numerical examples given above were selected for ease of computation and it will be appreciated that other values of parameters could be used. For example, the set-point current could be 85 kA and the cell voltage could be 4.8 volts, but exactly the same procedures discussed above would still apply.

The invention provides a number of advantages including simplified equipment, reliability and speed of detection of changes in Vb.

Obviously, a sudden increase in potline current will also enable the computer to determine any incorrect Vb values. Further, due to the high accuracy rendered by the system according to the invention, even small current excursions will cause simultaneous deviation of the normal continuum of the total voltage and enable the computer to filter the unevenness by applying the proper Vb (back e.m.f.). That is, if the voltage is lower, decrease Vb and if it is higher, increase Vb.

I claim:

1. A method of measuring current independent corrected cell potentials in an aluminum potline having a plurality of cells connected in series, comprising:
   (a) generating a first signal having a frequency proportional to current through said cells, said signal having a predetermined frequency when said current is at a set-point value,
   (b) determining a time interval by counting cycles of said first signal from a start time unit a predetermined count value is reached,
   (c) generating a plurality of second signals each having a frequency proportional to total voltage across a different one of said cells,
   (d) generating a plurality of third signals each having a frequency proportional to different possible values of back e.m.f. of a cell,
   (e) counting cycles of said second signals during said time interval to obtain counts proportional to current independent total cell voltages,
   (f) using said third signals to decrement, during said time interval, counters having counts proportional to the different possible values of back e.m.f. to thereby determine any errors values that might exist for the back e.m.f. values as a result of a change in said current from its set-point value, and
   (g) algebraically subtracting the error values determined in step (f) from the current independent total cell voltages to determine current independent corrected cell voltages.

2. A method as claimed in claim 1 wherein an erroneous back e.m.f. value for a cell can be detected by comparing the current independent cell voltage before and after a change in said current, a sudden deviation of the current independent cell voltage being indicative of an incorrect value of back e.m.f.

3. A method as claimed in claim 2 wherein a drop in the current independent cell voltage indicates a lower back e.m.f. and vice versa.

4. Apparatus for measuring current independent corrected cell potentials in an aluminum potline having a plurality of cells connected in series, comprising:
   (a) means for generating a first signal having a frequency proportional to current through said cells, said signal having a predetermined frequency when said current is at a set-point value,
   (b) means for determining a time interval by counting cycles of said first signal from a start time until a predetermined count value is reached,
   (c) means for generating a plurality of second signals each having a frequency proportional to total voltage across a different one of said cells,
   (d) means for generating a plurality of third signals each having a frequency proportional to different possible values of back e.m.f. of a cell,
   (e) means for counting cycles of said second signals during said time interval to obtain counts proportional to current independent total cell voltages,
   (f) counter means containing, at the start of each time interval, counts proportional to different possible values of back e.m.f. and being decremented by said third signals during said measurement interval to thereby determine any error values that might exist for the back e.m.f. values as a result of a change in said current from its set-point value, and
   (g) means for algebraically subtracting the error values from the current independent total cell voltages to determine current independent corrected cell voltages.

5. Apparatus as claimed in claim 4 wherein said means for counting cycles of said first signal is started by a signal from a computer.

6. Apparatus as claimed in claim 5 wherein said time interval is of the order of one second when the current through the cells is at a predetermined set-point value.

7. Apparatus as claimed in claim 5 wherein the means specified in step (g) comprises a computer.

8. Apparatus as claimed in claim 7 wherein said means for counting cycles of said first signal produces a stop signal when said predetermined count value is reached, said stop signal stopping the counting means referred to in steps (e) and (f).

9. Apparatus as claimed in claim 8 wherein the counting means of step (e) communicate with an interface and control unit via fibreoptic lines.

10. Apparatus as claimed in claim 9 wherein said interface and control unit includes a buffer memory for storing the readings of the various counting means for transmission, on request, to said computer.

* * * * *